United States Patent [19]
Ichikawa

[11] Patent Number: 6,034,903
[45] Date of Patent: Mar. 7, 2000

[54] SEMICONDUCTOR MEMORY DEVICE WITH IDENTIFICATION FUSE

[75] Inventor: Takeshi Ichikawa, Tokyo, Japan

[73] Assignee: Oki Electric Industry Co., Ltd., Tokyo, Japan

[21] Appl. No.: 09/146,753

[22] Filed: Sep. 4, 1998

[30] Foreign Application Priority Data

Oct. 16, 1997 [JP] Japan .................................... 9-283890

[51] Int. Cl.[7] ..................................................... G11C 7/00
[52] U.S. Cl. ........................................ 365/200; 365/225.7
[58] Field of Search ................................. 365/200, 225.7, 365/230.03, 230.06

[56] References Cited

U.S. PATENT DOCUMENTS

| | | | |
|---|---|---|---|
| 5,309,394 | 5/1994 | Wuertz et al. | 365/189.03 |
| 5,526,317 | 6/1996 | McClure | 365/225.7 |
| 5,563,821 | 10/1996 | Kumagai et al. | 365/96 |
| 5,579,266 | 11/1996 | Tahara | 365/200 |
| 5,612,918 | 3/1997 | McClure | 365/200 |

*Primary Examiner*—Son Mai
*Attorney, Agent, or Firm*—Jones Volentine, LLP

[57] ABSTRACT

Disclosed is a semiconductor memory in which a repair device is easily positioned with respect to a redundancy fuse for a designation of replacement and a defect identification fuse. A semiconductor memory 1 includes sixteen blocks I/O300–I/O315 containing regular memory cells and redundancy memory cells, a fuse area 2 on one side, and sixteen I/O pads 3a–3p serving as connecting points, to the outside, of an internal circuit. The fuse area 2 includes a row redundancy fuse region 21, a column redundancy fuse region 22 and an operating fuse region 23. The operating fuse region 23 embraces operating fuses 231, 232 and an identification fuse 4 cut off when the internal circuit is defective, which are disposed adjacent to each other. An identification pad 5 for outputting a state of the identification fuse 4 to the outside is provided adjacent to the fuse area 2.

13 Claims, 15 Drawing Sheets

SEMICONDUCTOR MEMORY DEVICE WITH IDENTIFICATION FUSE

BACKGROUND OF THE INVENTION

The present invention relates generally to a semiconductor memory such as a DRAM etc. and, more particularly, to a semiconductor memory including redundancy memory cells with which defective cells in the body memory can be replaced.

The semiconductor memory is unusable as a product if all the memory cells do not normally function. Providing that the semiconductor memory having the regular memory cells which are all normal is treated as a good-quality memory, however, the yield might decrease. The semiconductor memory is therefore provided beforehand with redundancy memory cells as preparatory memory cells in addition to the regular memory cells, and, if there occurs a regular memory cell which does not normally function, the redundancy memory cell is utilized by the defective memory cell being electrically replaced with this redundancy memory cell.

The defective memory cell contained in the regular memory cells is detected in a wafer test at a stage before a wafer is sliced into chips (dies) of the individual semiconductor memories. The wafer test for the semiconductor memory is classified into two stages, i.e., a primary inspection (a pre-wafer test) for examining whether or not the regular memory cells normally function and judging, if there is a defective cell, whether or not this defective cell can be replaced with the redundancy memory cell, and a secondary inspection (a final wafer test) for examining after a necessary replacing process (a defect repairing process) whether or not the memory cell normally functions in an as-replaced state.

As a result of the primary inspection, the tested semiconductor memories are classified into three groups such as a group (1) in which all the regular memory cells exhibit a normal good quality, a group (2) in which some of the regular memory cells are defective, and the chip is still repairable by replacing the defective cells with the redundancy cells, and a group (3) containing unrepairable defects such that the defective cells among the regular memory cells are numerous enough not to be replaceable with the redundancy memory cells.

The primary and secondary inspections each include a plurality of item tests. The memory classified into the defective memory group (3) is disposed of after being sliced into the chips, and therefore an implementation of the secondary inspection for the memory of this group (3) leads to a futile expansion of the testing time. Such being the case, the semiconductor memory provided with a defect identification fuse within a circuit is disclosed in, e.g., Japanese Patent Application Laid-Open Publication Nos.5-47862 and 7-30068.

If the defect identification fuse disclosed in those Publications is used, in the memory classified into the defect memory group (3) as a result of the primary inspection, the identification fuse is cut off, and state of the identification fuse is detected at first in the secondary inspection, whereby the test for the memory with the identification fuse cut off is discontinued upon cutting off this fuse, and the test can be shifted to a next memory. Note that in the embodiment disclosed in Japanese Patent Application Laid-Open Publication No.5-47862, the identification fuse is provided between a GND terminal and dummy terminal. Japanese Patent Application Laid-Open Publication No.7-30068 does not disclose which position the identification fuse is disposed within the semiconductor memory.

A first problem inherent in the prior art described above is that there is no disclosure about a relationship between a position of the fuse for designating the replacement of the defective regular memory cell with the redundancy memory cell and a position of the identification fuse. Each fuse is cut off according to the necessity by a laser by use of a repair device when in the replacing process, however, precise positioning per chip is indispensable for cutting off the fuse provided in a more minute region than and within the hyperfine chip. Accordingly, if the positional relationship between the fuse for designating the replacement and the identification fuse is not specified as in the devices disclosed in the above Publications, there must be a necessity for positioning for cutting off each of the designation fuse and the identification fuse, and the yield in the replacement process therefore declines.

A second problem inherent in the prior art is that it is possible to only distinguish between the good-quality chip and the defective chip in terms of a state of the identification fuse, but it is impossible to distinguish what kind of error occurs with respect to the chip judged to be defective. Information on such a defective chip is recorded in a test record (LOG) and fed back to the manufacturing process in order to enhance the yield, and then a measure is to be taken. The LOG is, however, managed with only a serial number of the wafer, and hence it might become unobvious in some cases to grasp what kind of defect appears in the chip, and which position the chip concerned is disposed within the wafer. In such a case, no measure can be taken.

A third problem inherent in the prior art is that the fuse dedicated to the identification is provided separately from the address designation fuse, and therefore the number of fuses is larger than in the device having no identification fuse.

To obviate the above-described first problem inherent in the prior art, a first object of the invention in the present application is to provide a semiconductor memory in which a repair device can be easily positioned with respect to a redundancy fuse for a designation of replacement and a defect identification fuse when in a replacing process.

To obviate the above-described second problem inherent in the prior art, a second object of the invention in the present application is to provide a semiconductor memory capable of not only distinguishing between a good-quality chip and a defective chip but also judging what kind of error occurs in the case of the defective chip.

To obviate the above-described third problem inherent in the prior art, a third object of the invention is to provide a semiconductor memory capable of distinguishing between the good-quality chip and the defective chip in a secondary inspection without providing a fuse dedicated to an identification.

SUMMARY OF THE INVENTION

A semiconductor memory according to the first aspect is characterized by such a construction that address designation redundancy fuses and an identification fuse which constitute a repairing circuit are disposed in a side-by-side relationship within the same fuse region. To be specific, a semiconductor memory according to the first aspect comprises a regular memory cell having a predetermined capacity, a redundancy memory cell replaceable with a part of the regular memory cells, an I/O pad serving as a connecting point, to the outside, of an internal circuit including the regular memory cell and the redundancy memory cell, a redundancy fuse cut off, if the part of the regular memory cells is defective, to make a replacement with the redundancy memory cell by specifying the defective part, an identification fuse provided within a fuse region in a side-by-side relationship with the redundancy fuse and cut off when a chip is defective enough to be unrepairable, and an outputting element for outputting a state of the identification fuse to the outside.

According to the first aspect, when judging that a chip is defective enough to be unrelievable in a primary inspection, the identification fuse is cut off in a repairing process, whereby it is feasible to readily judge that the chip concerned is defective by detecting a state of the identification fuse in a secondary inspection.

In the semiconductor memory according to the first aspect, the fuse region may embrace the plurality of redundancy fuses and an operating fuse cut off when making effective the designation by the redundancy fuse. In this case, the identification fuse may be disposed adjacent to the operating fuse. Further, the identification fuse may be constructed of a single fuse or a plurality of fuses. When the identification fuse is constructed of the plurality of fuses, a specified fuse among the plurality of fuses may be, if the chip has a repairable defect, cut off corresponding to a defect category. Moreover, the outputting element according to the first aspect may involve the use of an identification pad dedicated to a detection of a state of the identification fuse, or a double-duty pad serving also as an I/O pad. In the case of using the double-duty pad, the circuit may be constructed so that the double-duty pad is, if the identification fuse is not cut off, electrically connected to the internal circuit and is, if the identification fuse is cut off, electrically disconnected from the internal circuit.

A semiconductor memory according to the second aspect is characterized by providing a plurality of recording elements such as the identification fuses. Namely, the semiconductor memory according to the second aspect comprises a regular memory cell having a predetermined capacity, a redundancy memory cell replaceable with a part of the regular memory cells, an I/O pad serving as a connecting point, to the outside, of an internal circuit including the regular memory cell and the redundancy memory cell, a redundancy fuse cut off, if the part of the regular memory cells is defective, to make a replacement with the redundancy memory cell by specifying the defective part, a plurality of recording elements, provided corresponding to defect categories, in which a state is, if a chip is defective enough to be unrepairable, set corresponding to the defect category, and a plurality of outputting elements for outputting states of the recording elements to the outside.

According to the second aspect, when the chip is judged to be defective enough to be unrepairable in the primary inspection, the state is changed (in the case of the fuse, this fuse is cut off) corresponding to a category of defect in which one of the plurality of recording elements is detected in the repairing process, whereby the chip concerned can be easily judged to be defective in the secondary inspection, and it is feasible to recognize, even after the chip has been separated from a wafer, what kind of category the defect caused belongs to from the information recorded on the chip concerned.

The recording element according to the second invention may involve the use of the identification fuse provided separately from the redundancy fuse. In this case, the outputting element may be a dedicated identification pad for outputting a state of the identification fuse, or a double-duty pad serving also as the I/O pad. Note that the recording element according to the second aspect, in the case of including the operating fuse cut off when making effective the designation by the redundancy fuse, may involve such a contrivance that the plurality of fuses contained in the redundancy fuse can be used as double-duty fuses in combination with the judging circuit. The judging circuit, if the double-duty fuse is cut off, and if the operating fuse if not cut off, judges that the chip is defective enough to be unrepairable, and makes the outputting element output a state of the double-duty fuse to the outside. Further, when judged to be defective, the defect category can be known by detecting which double-duty fuse is cut off.

A semiconductor memory according to the third aspect is characterized such that a part of the address designation redundancy fuses is used as a double-duty fuse for judging a defect, and there is provided a judging circuit for judging whether the double-duty fuse is cut off for the reason of a replacement with the redundancy memory, or for the reason of the chip being defective enough to be unrelievable by use of the double-duty fuse in combination with the operating fuse cut off when making effective the designation by the redundancy fuse. To be specific, a semiconductor memory according to the second aspect comprises a regular memory cell having a predetermined capacity, a redundancy memory cell replaceable with a part of the regular memory cells, an I/O pad serving as a connecting point, to the outside, of an internal circuit including the regular memory cell and the redundancy memory cell, a redundancy fuse cut off, if the part of the regular memory cells is defective, to make a replacement with the redundancy memory cell by specifying the defective part, a part of the redundancy fuses being used as a double-duty fuse for a defect identification, an operating fuse cut off when making effective the designation by the redundancy fuse, a judging circuit for judging that a chip is defective enough to be unrepairable when a part of the double-duty fuses is cut off and when the operating fuse is not cut off, and an outputting element for outputting a state of the double-duty fuse to the outside when the judging circuit makes a judgement of being defective.

According to the third aspect, when the chip is judged to be defective enough to be unrepairable in the primary inspection, the double-duty fuse is cut off without cutting off the operating fuse in the repairing process, whereby the judging circuit judges that the chin is defective and makes the outputting element output the state of the double-duty fuse to the outside. In the secondary inspection, it is possible to easily judge that the chip concerned is defective from the state of the double-duty fuse which is outputted from the outputting element.

The outputting element according to the third invention may involve the use of a double-duty pad serving also as the I/O pad. The double-duty pad is, if the chip is judged to have a repairable defect, electrically disconnected from the internal circuit and is, if the chip is not judged to be defective, electrically connected to the internal circuit. The double-duty fuse for judging the defect is constructed of a single fuse or a plurality of fuses among the plurality of redundancy fuses.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Embodiments of a semiconductor memory according to the present invention will hereinafter be described. The invention is herein explained by way of six embodiments. To start with, relationships between the respective embodiments and first through third aspects are briefly explained. The respective embodiments are classified as shown in the following Table 1 depending on whether a fuse for identification is dedicated or use in combination with a redundancy fuse and whether the number of fuse is single or plural.

TABLE 1

| Identification Fuse (Dedicated Use) | Single Embodiments 1, 2 | Plural Embodiments 4, 5 |
|---|---|---|
| Double Duty as Redundancy Fuse | Embodiments 3 | Embodiment 6 |

The first aspect is characterized such that the is identification fuse and the redundancy fuse are disposed in position proximal to each other. The embodiments 1, 2, 4 and 5 meet this requirement. Further, the second invention is characterized by providing a plurality of recording elements, which requirement is satisfied by the embodiments 4, 5 and 6. Further, the third aspect is characterized in that the redundancy fuse for specifying an address serves also as a defect judging element, which requirement is met by the embodiments 3 and 6.

[Embodiment 1]

Figure 1:
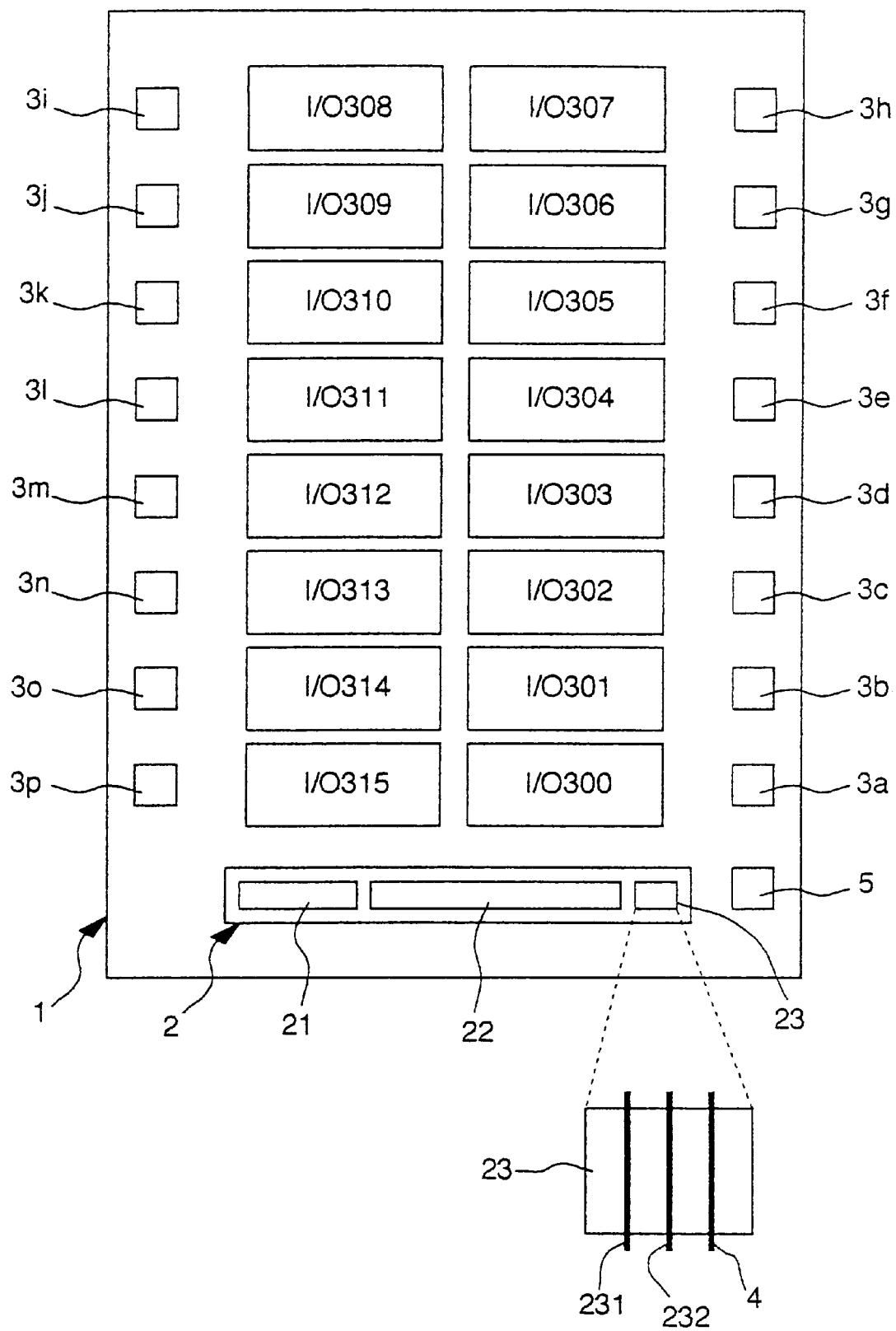
FIG. 1 is an explanatory diagram showing a construction of a semiconductor memory in an embodiment 1.

FIG. 1 shows a construction of the semiconductor memory in the embodiment 1. In each of the embodiments, a dynamic random access memory (DRAM) 1 having a capacity 4 Mega bits (Mb) is exemplified as a semiconductor memory. This semiconductor memory 1 is provided with 16 memory blocks I/0300–I/0315 each including regular memory cells for 256 kilo bits (Kb) and redundancy memory cells of a predetermined capacity, and also provided with 16 I/O pads 3a–3p on both sides which serve as connecting points, to the outside, of an internal circuit including the regular memory cells and the redundancy memory cells as well as being provided with a fuse area 2 on one lower side in FIG. 1.

The fuse area 2 contains a row redundancy fuse region 21, a column redundancy fuse region 22, and an operating fuse region 23. The operating fuse region 23 contains two operating fuses 231, 232 cut off when making designation effective by the redundancy fuse included in each of the redundancy fuse regions 21, 22, and an identification fuse 4 cut off if a chip is defective enough to be unrepairable, which fuses are disposed adjacent to each other. Further, a dedicated identification pad 5 serving as an output element for outputting a status of the identification fuse 4 to the outside, is provided adjacent to the fuse area 2. As in the embodiment 1, the identification fuse can be provided simply by adding a single piece of fuse adjacent to the existing operating fuses 231, 232, and hence there must be a slight change in design by adding the fuse.

Figure 2:
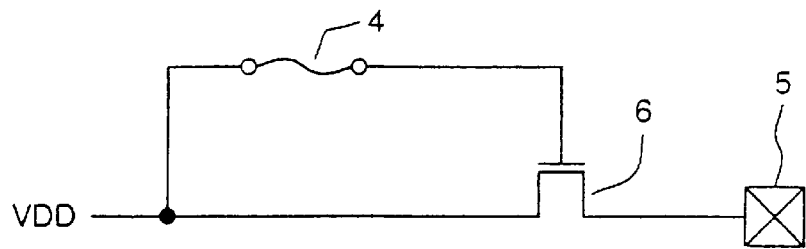
FIG. 2 is a circuit diagram showing a relationship between an identification fuse and an identification pad of the semiconductor memory of the semiconductor memory in the embodiment 1.

The identification fuse 4 is, as in the way illustrated in FIG. 2, connected to the identification pad 5. More specifically, one end of the identification fuse 4 is connected to a power supply voltage VDD supplied from outside, and the other end thereof is connected to a switching terminal of a switch 6. One terminal excluding the switching terminal of a switch 6 is connected to the power supply voltage VDD, and the other terminal thereof is connected to the identification pad 5. When the identification fuse 4 is not cut off, the switch is switched ON upon applying the power supply voltage, and the identification pad assumes the same electric potential (High) as VDD. Whereas if the identification fuse 4 is cut off, however, the electric potential of the identification pad becomes unfixed (HIZ) even by applying the power supply voltage.

Figure 3:
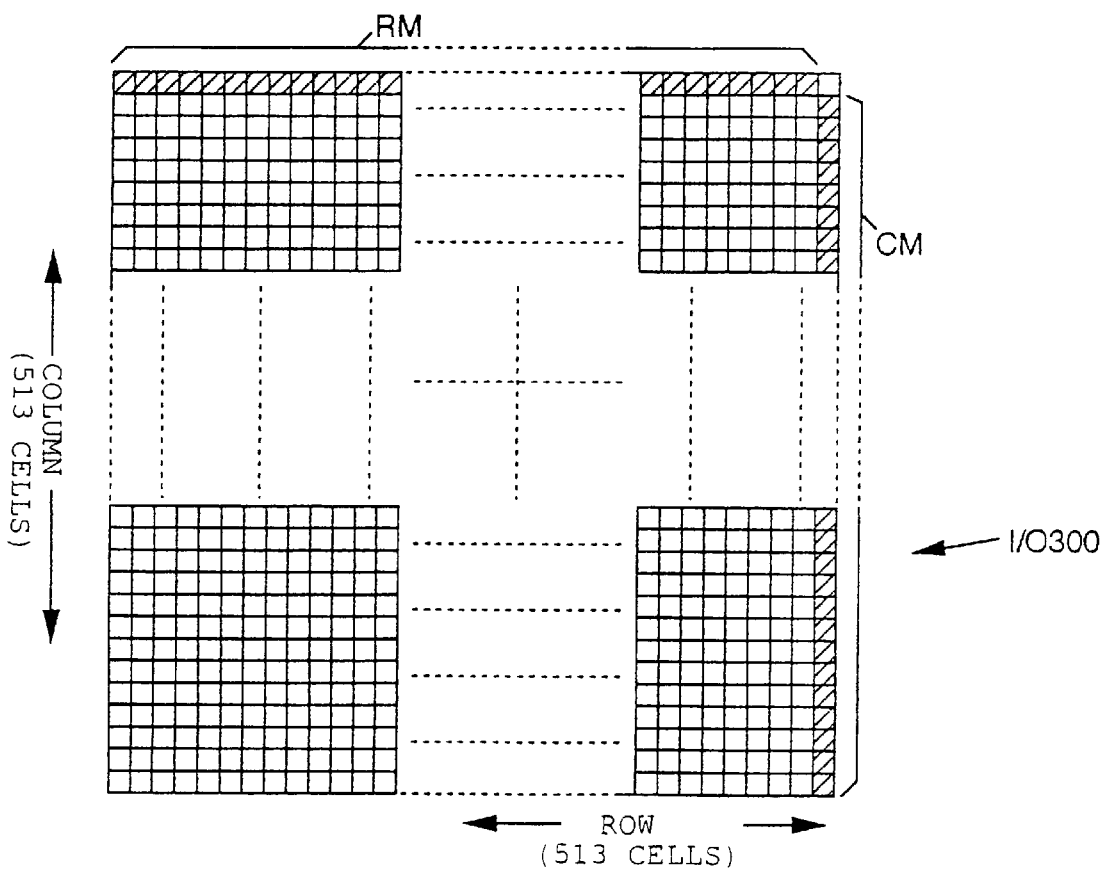
FIG. 3 is an explanatory diagram showing an array of memory cells in a memory block of the semiconductor memory in the embodiment 1.

The memory block I/0300, as shown in FIG. 3, structures a square matrix in which 513 pieces of memory cells are arrayed both in row and in column. In this square matrix, the regular memory cells occupy 512×512=262114 bits excluding the region shown by oblique lines, one-row 512 bits shown by the oblique lines excluding the regular memory cells are ensured for a row redundancy memory cells RM, and one-column 512 bits are ensured for column redundancy memory cells CM. Other memory blocks I/0301–I/0315 take the same structure as I/0300.

Each of the redundancy fuses contained in the row redundancy fuse region 21 and the column redundancy fuse region 22 incorporates, if a defective cell is contained in the regular memory cells in each memory block, a function of specifying the defective cell based on the row or column unit and replacing it with the row redundancy memory cell RM or the column redundancy memory cell CM. The regular memory cells in each memory block are structured of the (512×512) matrix as shown above, and therefore 16-bit address information is required to specify one row or one column in this matrix. Two fuses are needed for "0" and "1" in order to express 1 bit, and consequently 32 fuses are necessary for designating a 16-bit address.

Figure 4:
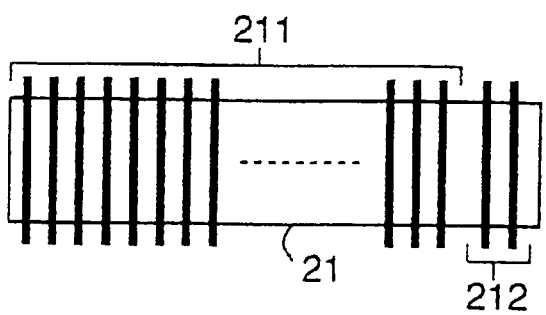
FIG. 4 is an explanatory diagram showing a configuration of a row redundancy fuse of the semiconductor memory in the embodiment 1.

The row redundancy fuse region 21 is, as shown in FIG. 4, provided with a row address designation fuse 211 for specifying based on one-row unit a defective part in the regular memory cell, and two row select fuses 212 on the whole for making effective the address designation by the address designation fuse 211. There are provided totally 256 row address designation fuses 211, wherein the fuses 211 are prepared by 32 pieces for two adjacent memory blocks, e.g., I/0300 and I/0315, or I/0303 and I/0312 which are set as one tuple, and the row address can be specified per tuple. Namely, as for the designation of the row address, the two memory blocks adjacent to each other are treated as one unit, and, even if the defective cell is contained in only one block, the regular memory cell in the other block can be replaced with the row redundancy memory cell. The row select fuse 212 is cut off when the address designation by the row address designation fuse 211 is made effective, and the replacement with the redundancy memory cell is conducted in the internal circuit only when cut off. If the row select fuse 212 is not cut off, and even when the row address designation fuse is cut off, the replacement with the row redundancy memory cell is not carried out. In the present specification, the "row redundancy fuse" has a concept embracing the row address designation fuse 211 and the row select fuse 212 as well.

Figure 5:
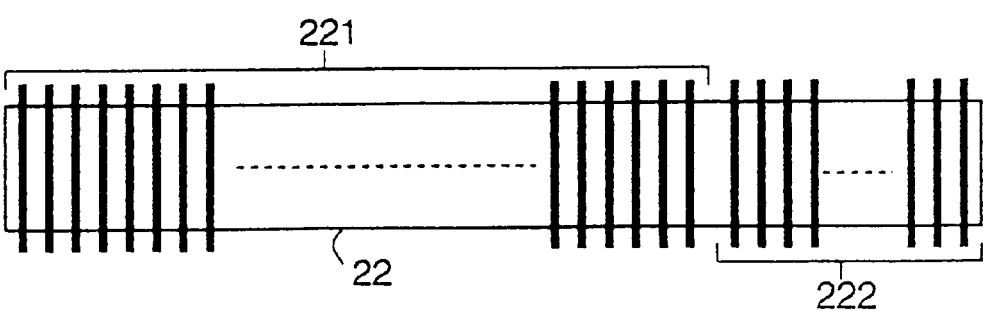
FIG. 5 is an explanatory diagram showing a configuration of a column redundancy fuse of the semiconductor memory in the embodiment 1.

On the other hand, the column redundancy fuse region 22 is, as shown in FIG. 5, provided with a column address designation fuse 221 for specifying based on one-column unit a defective part in the regular memory cell, and a column select fuse 222 for making effective the address designation by the address designation fuse 221. There are provided totally 512 of column address designation fuses 221, wherein the fuses 221 are prepared by 32 pieces per memory block, and the column can be designated per memory block. Totally 16 column select fuses 222 are provided by ones per memory block, and are each cut off when the address designation by the column address designation fuse 221 is made effective per memory block. If the column select fuse 222 corresponding to a specific memory block is not cut off, and even when the column address designation fuse 221 corresponding to this specific memory block is cut off, the replacement with the column redundancy memory cell is not effected. In the present specification, the "column redundancy fuse" has a concept embracing the column address designation fuse 221 and the column select fuse 222 as well.

The row operating fuse 231 is one of the two operating fuses included in the operating fuse region described above, and the column operating fuse 232 is the other thereof, and these operating fuses are cut off when permitting the replacements of the regular memory cells designated by the row and column redundancy fuses with the redundancy cells.

Figure 6:
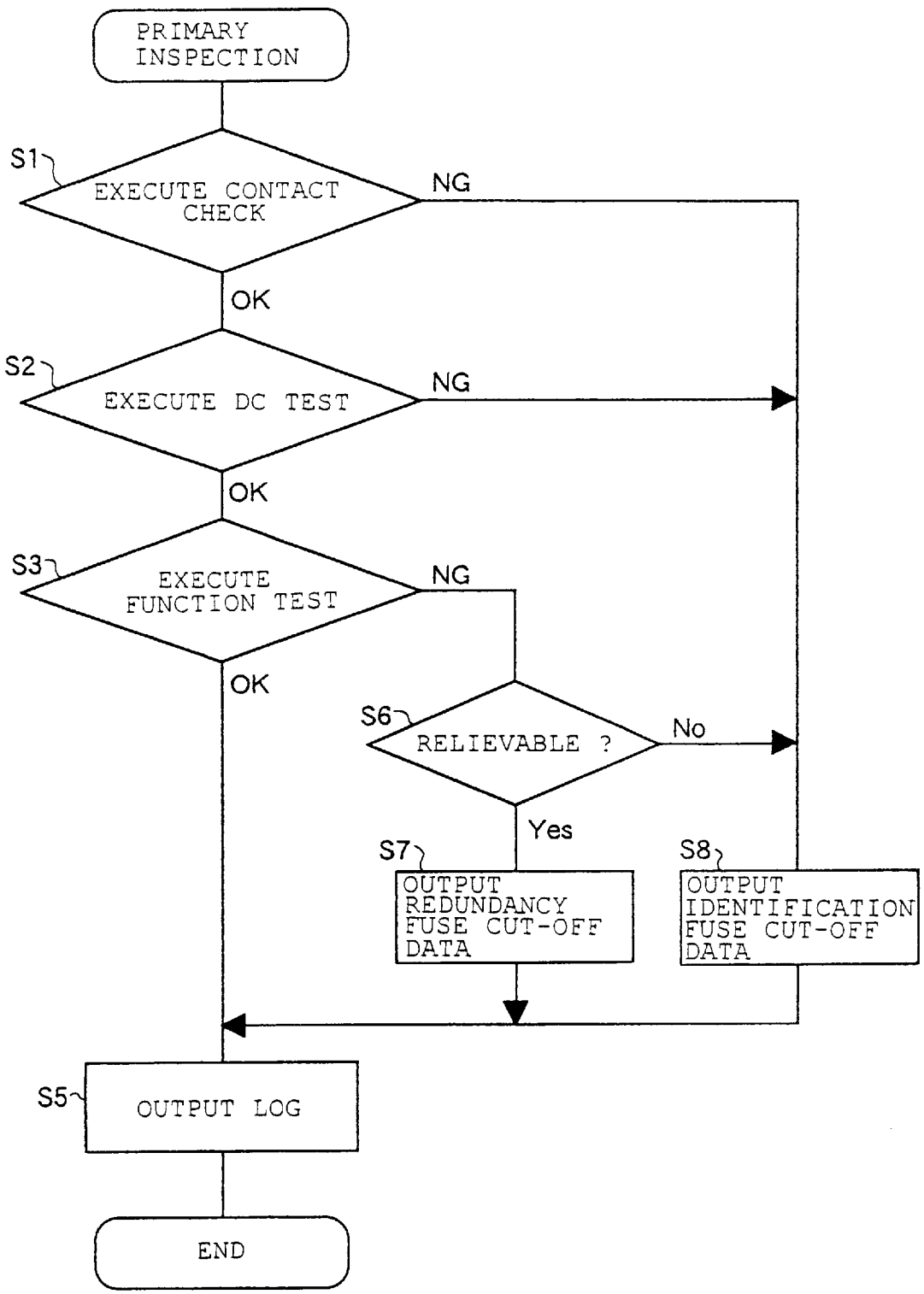
FIG. 6 is a flowchart showing processes in a primary inspection of a wafer test for the semiconductor memory in the embodiment 1.
Figure 7:
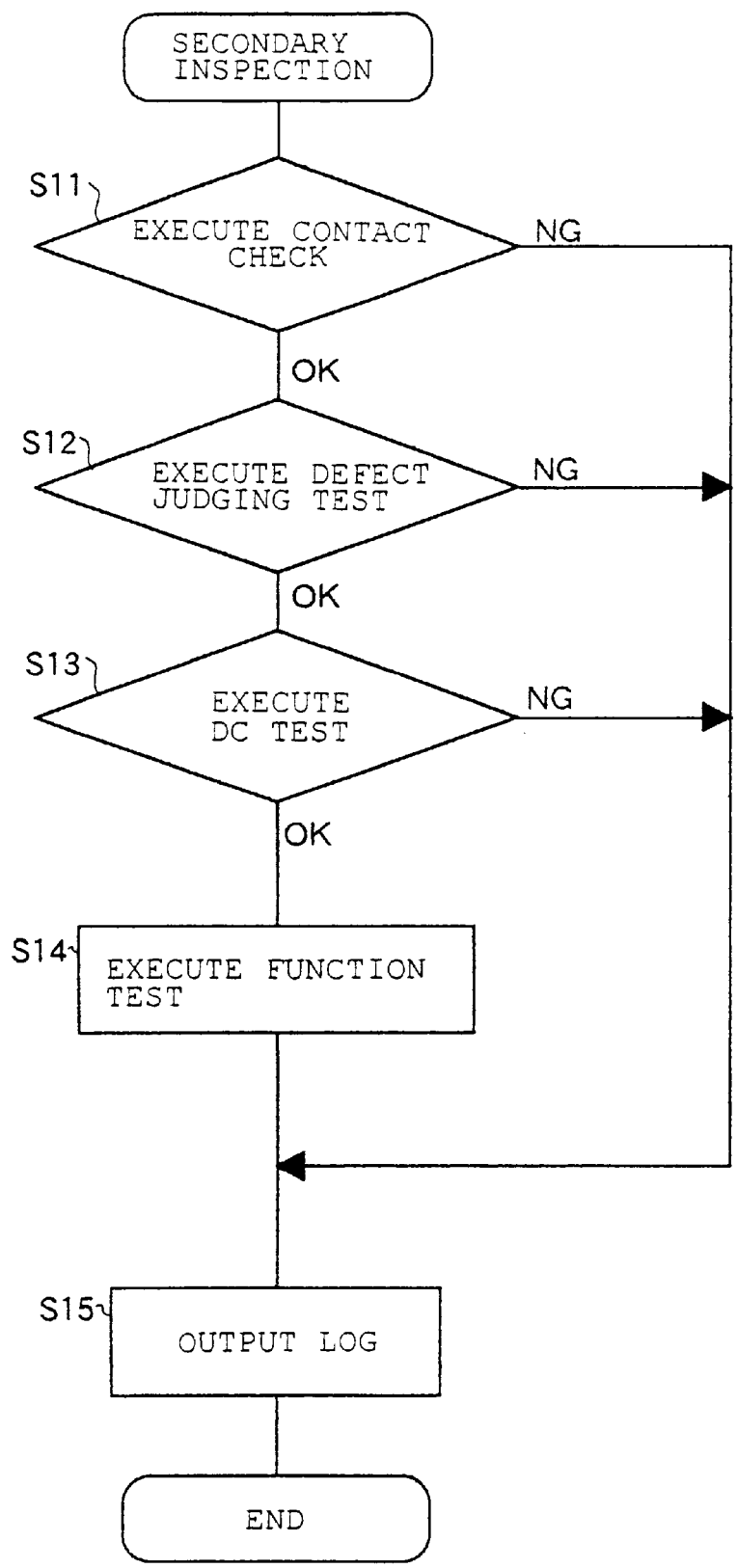
FIG. 7 is a flowchart showing processes in a secondary inspection of the wafer test for the semiconductor memory in the embodiment 1.

Next, a wafer test for the semiconductor memory in the embodiment 1 is discussed in conjunction with flowcharts shown in FIGS. 6 and 7. The wafer test is executed at a stage before the wafer is sliced into a chip (die) of an individual semiconductor memory. The wafer test is classified into a primary inspection (a pre-wafer test) for examining whether or not the regular memory cell functions normally and whether or not, if there exists a defective cell, this defective cell can be replaced with the redundancy memory cell; and a secondary inspection (a final wafer test) for examining whether or not the memory cell, after executing a necessary replacing process (a defect repairing process), can function normally in an as-replaced state. FIG. 6 shows processes in the primary inspection, and FIG. 7 shows processes in the secondary inspection, respectively.

The primary inspection takes, as shown in FIG. 6, three stages such as a contact check in step S1, a DC test in step S2 and a function test in step S3, and these tests are implemented in sequence. The contact check is intended to confirm connections between a tester and the I/O pads 3a–3p, and the DC test is defined as a rating test for examining whether or not dissipation power is set as rated and so forth. If an error is detected in the contact test or in the DC test, the tested chip is judged to be a product defective enough not to be repairable, and the data is outputted for cutting off the identification fuse in the step S4 without performing a subsequent test. Then, a record (LOG) is outputted in step S5, thus finishing the primary inspection.

The function test is a test for examining whether the regular memory cell functions normally, wherein "0" and "1" are read and written based on the bit unit with respect to all the regular memory cells, and addresses of the memory cells exhibiting failures in the reading and writing processes are saved. After the reading/writing tests for all the regular memory cells have been ended, the tested chip containing no cells the reading/writing failures is judged to be good in quality, and the record (LOG) is outputted in step S5, thus finishing the primary inspection.

If there exist memory cells exhibiting the reading/writing failures in the function test, it is judged in step S6 whether or not the chip can be repaired by replacing these defective memory cells with the redundancy memory cells. If repairable, cut-off data of the redundancy fuse is outputted so as to designate the row/column addresses of the regular memory cells that should be replaced in step S7 as a repairable chips and the record (LOG) is outputted in step S5, thereby finishing the primary inspection.

As a result of the primary inspection, the tested semiconductor memories are classified into three groups such as a group (1) in which all the regular memory cells exhibit a normal good quality, a group (2) in which some of the regular memory cells are defective, and the chip is still repairable by replacing the defective cells with the redundancy cells, and a group (3) in which the defects are detected in the contact check or in the DC test, or there are unrepairable defects such that the defective cells among the regular memory cells are judged to be numerous enough not to be replaceable with the redundancy memory cells.

In the replacing process executed based on the primary inspection, the chip of the repairable group (2) is processed by a repair device on the basis of the redundancy fuse cut-off data outputted in step S7 in the primary inspection, and the selected column/row address designation fuses 211, 221 and column/row select fuses 212, 222 are cut off by a laser.

Further, the chip of the defective group (3) is processed by the repair device on the basis of the identification fuse cut-off data outputted in step S4 in the primary inspection, and the identification fuse 24 is cut off.

According to the construction of the embodiment 1, the identification fuse 4 is disposed adjacent to the two operating fuses in the operating fuse region 23, and hence, if any fuse becomes an object to be cut off, a positioning range of a laser head with respect to one chip can be limited small, whereby a yield of the replacing process can be enhanced.

The secondary inspection, as shown in FIG. 7, essentially consists of four stages such as a contact check in step S11, a defect judging test in step S12, a DC test in step S13 and a function test in step S14, and these tests are executed in sequence. The contact check, the DC test and the function test are substantially the same as the respective tests in the primary inspection. The defect judging test in step S12 is a test for measuring an electric potential of the identification cad 5 by applying the power supply voltage VDD to the terminal of the gate 6 connected to the identification pad 5. If the chip is good or repairable, then and the identification fuse 4 is not cut off in the primary inspection, in which case the electric potential of the identification pad 5 assumes a level (High) equal to the VDD. The chip is defective, and the identification fuse 4 is cut off, in which case the electric potential of the identification pad 5 becomes unfixed (HiZ). Accordingly, it is feasible to determine whether or not the chip is judged to be defective in the primary inspection by detecting the electric potential of the identification pad 5.

If the defect is detected at each stage of the contact check, the defect judging test and the DC test, the test for the objective chip should be discontinued upon detecting it, and the record (LOG) indicating the defect is outputted in step S15, thereby finishing the secondary inspection. Only the chips exhibiting good results of the 3-stage tests are qualified as objects of the function test. If not defective as a result of the function test, the record (LOG) proving a good chip is outputted in step S15. If the defect is detected, the record (LOG) proving the defective chip is outputted in step S15, thus coming to an end of the secondary inspection. With a provision of the defect judging test in step S12, as for the defective chip judged to be defective by executing the tests up to the function test in the primary inspection, the test for this chip can be discontinued by judging it to be defective at a much earlier stage in the secondary inspection, and the time required for testing can be therefore reduced.

[Embodiment 2]

Figure 8:
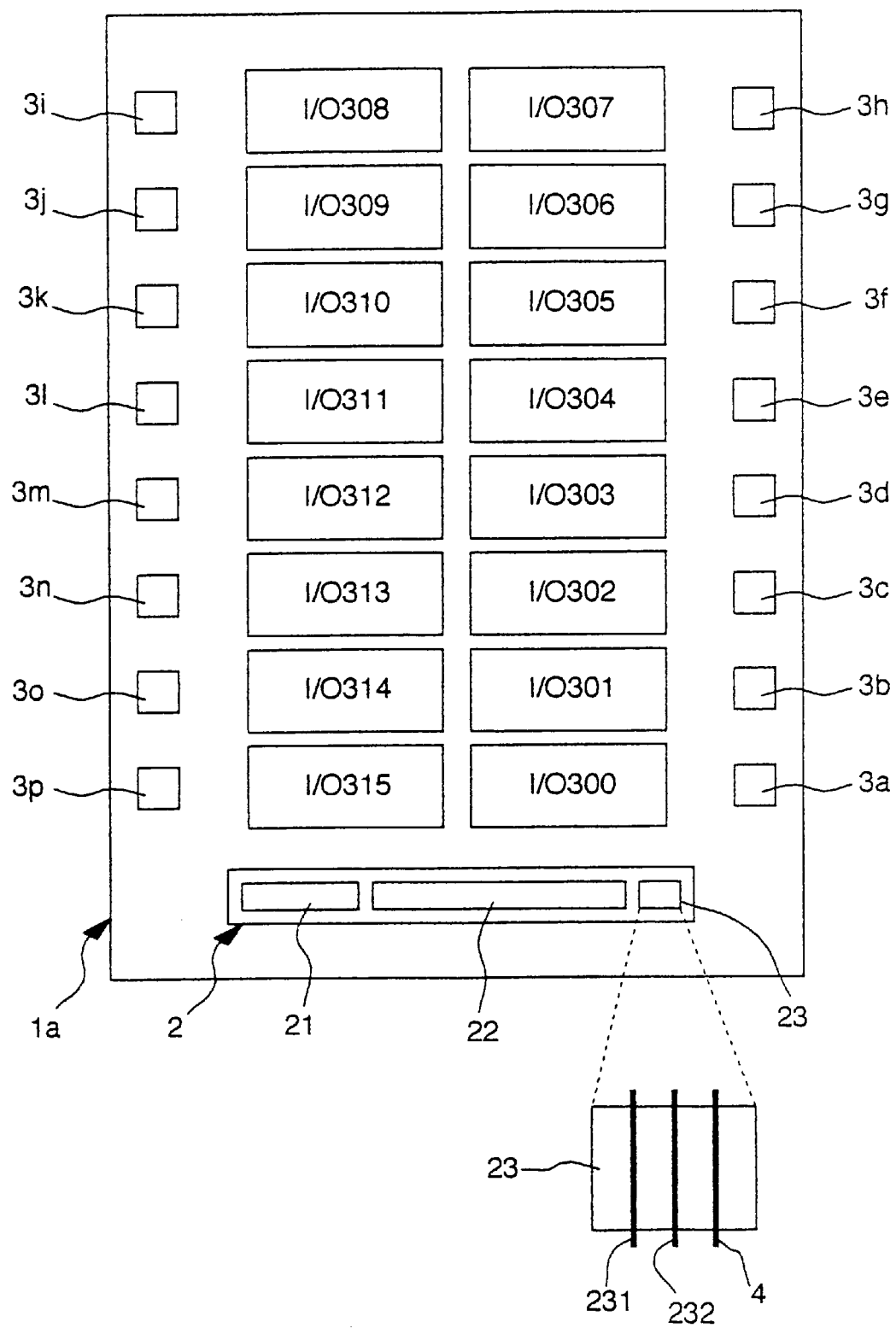
FIG. 8 is an explanatory diagram showing a construction of a semiconductor memory in an embodiment 2.

FIG. 8 shows a construction of a semiconductor memory in an embodiment 2. A semiconductor memory 1a in the embodiment 2 includes, as in the embodiment 1, the sixteen memory blocks I/0300–I/0315, the fuse area 2 containing the row redundancy fuse region 21, the column redundancy fuse region 22 and the operating fuse region 23, and the 16 I/O pads 3a–3p. The operating fuse region 23 is provided with the two operating fuses 231, 232 and the identification fuse 4 adjacent to each other. In the embodiment 2, however, an output element for outputting a state of the identification fuse 4 to the outside involves such a contrivance that the I/O pad 3a disposed lowest in the left column in FIG. 8 among the plurality of I/O pads 3a–3p is used as a double-duty pad. One of the existing I/O pads serves as an identification pad, thereby eliminating the necessity for changing a pad design for the conventional type of chip provided with no identification fuse and making it feasible to diverting the pad layout of the conventional type as it is. In particular, the double-duty pad as in the embodiment 2 is useful for the chip that is hard to ensure a space for increasing the pads.

Figure 9:
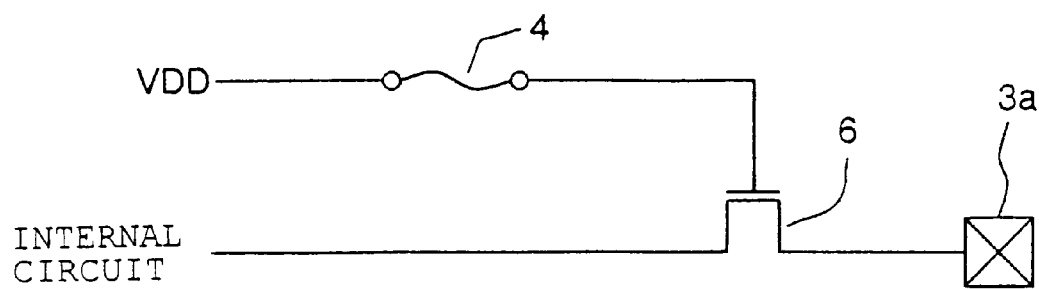
FIG. 9 is a circuit diagram showing a relationship between an identification fuse and a double-duty pad of the semiconductor memory in the embodiment 2.

A connecting relationship between the identification fuse 4 and the double-duty pad 3a becomes as shown in FIG. 9. That is, one end of the identification fuse 4 is connected to the power supply voltage VDD supplied from outside, and the other end thereof is connected to the switch terminal of the switch 6. One terminal excluding the switch terminal of the switch 6 is connected to the internal circuit, and the other terminal thereof is connected to the double-duty pad 3a. When the identification fuse 4 is not cut off, the gate is switched ON upon applying the power supply voltage, and the double-duty pad 3a is electrically connected to the internal circuit. An electric potential of the double-duty pad 3a assumes a High level or a Low level corresponding to a status of the internal circuit. When the identification fuse 4 is cut off, the double-duty pad 3a is disconnected from the internal circuit, and, even when the power supply voltage is applied, the electric potential of the double-duty pad 3a becomes unfixed (HiZ).

The wafer test for the semiconductor memory 1a in the embodiment 2 is executed in the same processes as those in the embodiment 1. In the defect judging test in the secondary inspection, however, the power supply voltage is applied to one end of the fuse, and the internal circuit connected to the switch 6 is fixed so that the output thereof assumes the High level. With this contrivance, it is feasible to make a judgement of being normal when the electric potential of the double-duty pad 3a takes the High level, and of being defective when the electric potential thereof becomes unfixed.

[Embodiment 3]

Figure 10:
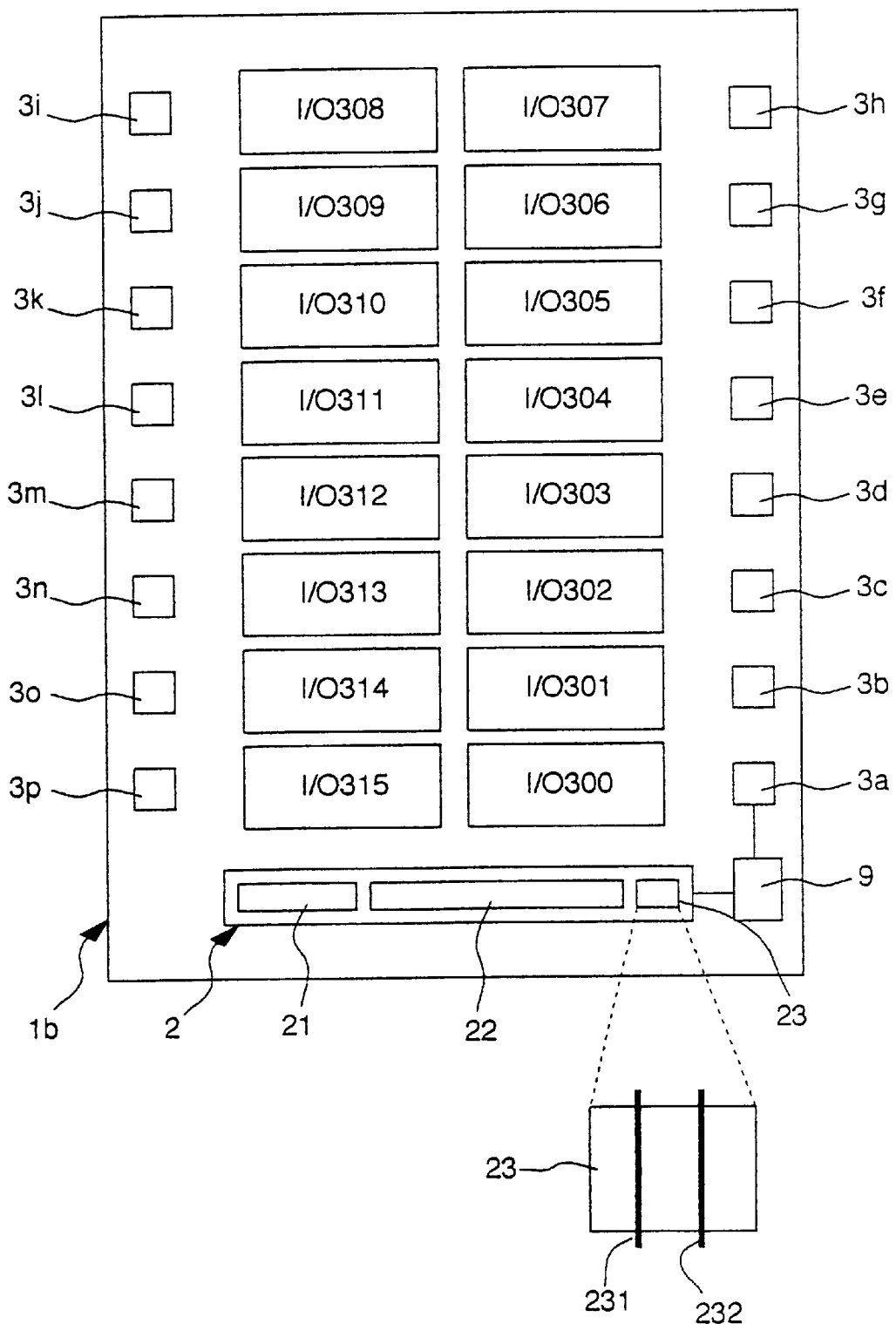
FIG. 10 is an explanatory diagram showing a construction of a semiconductor memory in an embodiment 3.

FIG. 10 shows a construction of a semiconductor memory in an embodiment 3. A semiconductor memory 1b in the embodiment 3 includes, as in the embodiment 1, the sixteen memory blocks I/0300–I/0315, the fuse area 2 containing the row redundancy fuse region 21, the column redundancy fuse region 22 and the operating fuse region 23, and the 16 I/O pads 3a–3p. In the embodiment 3, however, there is provided no fuse dedicated to the defect identification, and the operating fuse region 23 contains only the row operating fuse 231 and the column operating fuse 232. Further, the column redundancy fuse serves as a double-duty fuse in such a way that a part of this column redundancy fuse is used also for the defect identification, and there is provided a judging circuit 9 connected to this double-duty fuse and to the column operating fuse 232 embraced in the operating fuse region 23. An output element involves, as in the embodiment 2, such a contrivance that the I/O pad 3a disposed lowest in the left column in FIG. 8 among the plurality of I/O pads 3a–3p is used as a double-duty pad.

The column redundancy fuse in the embodiment 3 has, as in the same way with the column redundancy fuse in the embodiment 1 shown in FIG. 5, 256 pieces of column address designation fuses 221 and 16 column select fuses 222. In this embodiment, among those column select fuses 222, one specific fuse 222 corresponding to the memory block I/0300 functions as a double-duty fuse.

Figure 11:
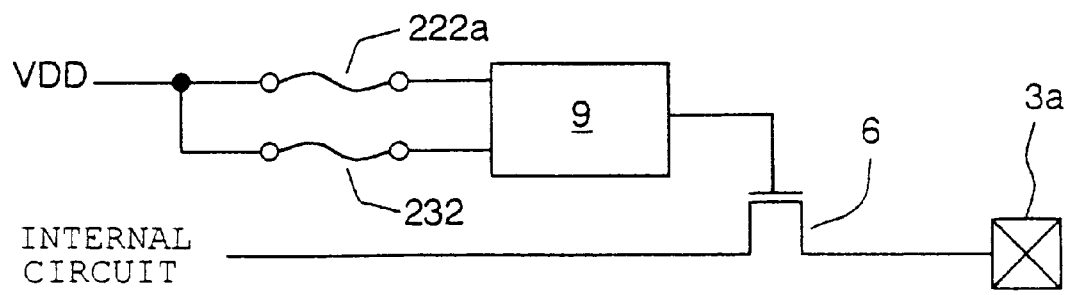
FIG. 11 is a circuit diagram showing a relationship between a fuse, a judging circuit and a double-duty pad in the embodiment 3.

A connecting relationship between each of the fuses, the double-duty pad 3a and the judging circuit 9 becomes as shown in FIG. 11. Namely, one end of the double-duty fuse 222a in the column select fuses 222 and of the column operating fuse 232 each are connected to the power supply voltage VDD supplied from outside, and the other ends thereof are connected to the judging circuit 9. An output of the judging circuit 9 is connected to the switching terminal of the switch 6. One terminal, excluding the switching terminal of the switch 6 is connected to the internal circuit, and the other terminal thereof is connected to the double-duty pad 3a. The judging circuit 9 monitors a state of the double-duty fuse 222a in the column select fuses 222 and a state of the column operating fuse 232, and controls the gate 6 in accordance with the states of these fuses.

The judging circuit 9 switches ON the switch 6 in a case where the double-duty fuse 222a in the column select fuses 222 is cutoff, and the column operating fuse 232 is cut off, and in a case where both of these fuses 222a, 232 are not cut off. As a result, the double-duty pad 3a is electrically connected to the internal circuit. On the other hand, if the column operating fuse 232 is not cut off in spite of the fact that the double-duty fuse 222a is cut off, the judging circuit 9 judges that the chip is defective, and therefore switches OFF the switch 6. As a consequence of this, the double-duty pad 3a is electrically disconnected from the internal circuit. That is, the judging circuit 9 incorporates a function of judging whether, if the double-duty fuse is cut off, this is done for the reason of the replacement with the redundancy memory or the reason of the chip being defective.

The wafer test for the semiconductor memory 1b in the embodiment 3 is carried out in the same processes as those in the embodiment 1. In the replacing process after the end of the primary inspection, if the chip is judged to be defective, the double-duty fuse 222a is cut off, while the column operating fuse 232 is left without being cut off. The way of dealing with the repairable chip is the same as the embodiment 1. In the defect judging test in the secondary inspection, the power supply voltage is applied to one end of the double-duty fuse 222a and of the column operating fuse 232, and the internal circuit connected to the gate 6 is fixed so that the output thereof assumes the High level. The judging circuit 9 switches OFF the switch 6 in a case where the column operating fuse 232 is not cut off, and the double-duty fuse 222a is cut off, and switches ON the switch 6 in cases other than the above-mentioned. The electric potential of the double-duty pad 3a remains unfixed (HiZ) during an OFF-period of the switch 6 and remains at the High level during an ON-period of the switch 6. Accordingly, it may be judged that the chip is normal when the electric potential of the double-duty pad 3a assumes the High level, and that the chip is defective when the electric potential thereof becomes unfixed.

In accordance with the embodiment 3, as in the embodiments 1 and 2, it is feasible to easily distinguish between the good-quality chip and the defective chip in the secondary inspection, and, in addition, an increase in the number of fuses can be avoided because of no necessity for newly providing the identification-dedicated fuses as in the embodiments 1 and 2 to the conventional semiconductor memory including no identification fuse.

[Embodiment 4]

Figure 12:
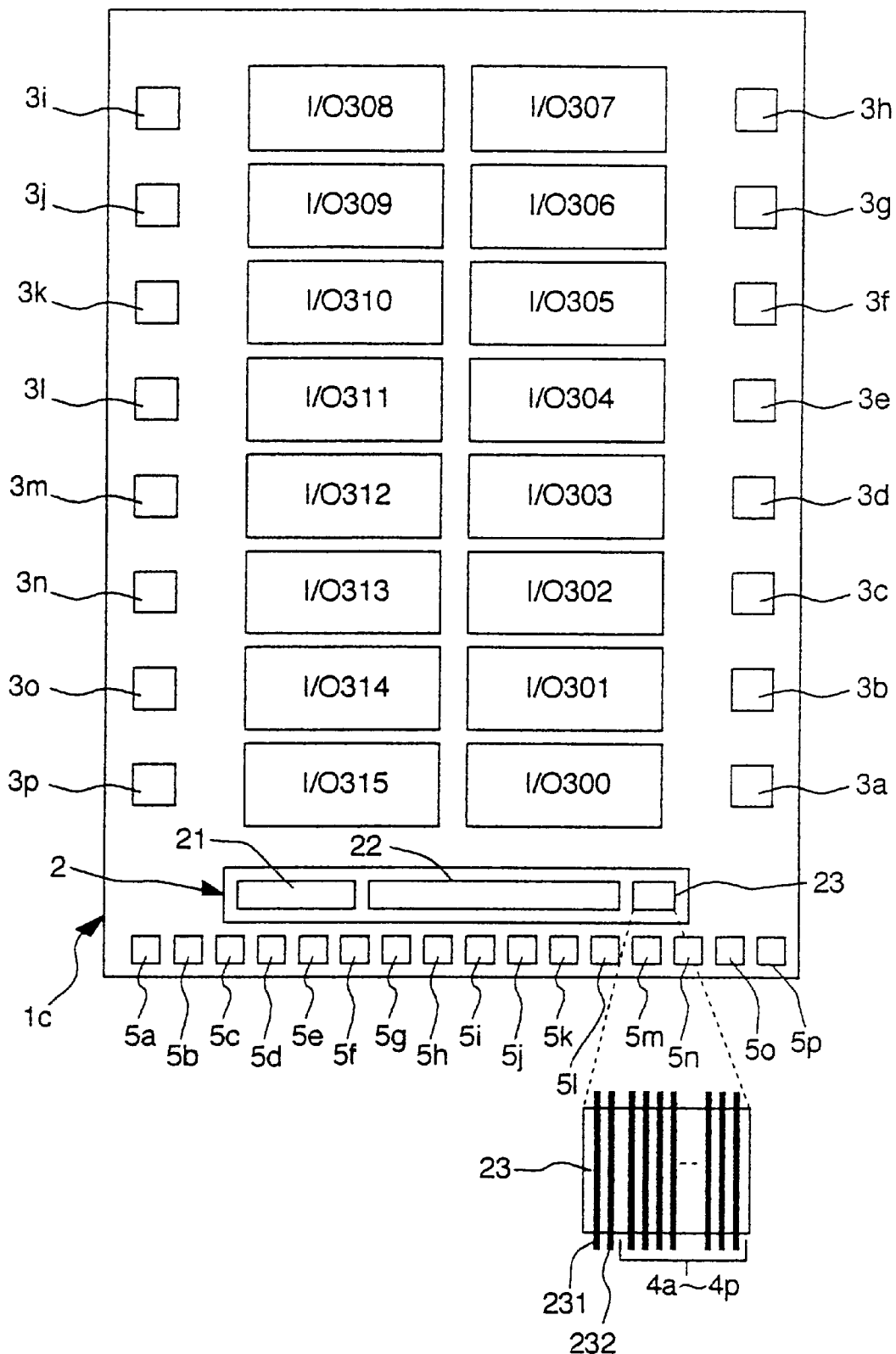
FIG. 12 is an explanatory diagram showing a construction of a semiconductor memory in an embodiment 4.

FIG. 12 shows a construction of a semiconductor memory in an embodiment 4. A semiconductor memory 1c in the embodiment 4 includes, as in the embodiment 1, the sixteen memory blocks I/0300–I/0315, the fuse area 2 containing the row redundancy fuse region 21, the column redundancy fuse region 22 and the operating fuse region 23, and the 16 pieces of I/O pads 3a–3p. In the operating fuse region 23, two operating fuses 231, 232 and sixteen identification fuses 4a–4p are arrayed in one direction. Further, sixteen identification pads 5a–5p are provided corresponding to the identification fuses 4a–4p on the lower side in the fuse area 2 in FIG. 12.

The identification fuses 4a–4p are dedicated fuses provided corresponding to categories of the defects and correspond to recording elements in which states are set in accordance with the categories of the defects. Namely, the respective identification fuses 4a–4p are made corresponding to the categories of the defects in the way which follows. For example, if there is an error in a dissipation power inspection in the DC test, the third identification fuse 4c is cut off, and, if unrepairable due to an error in the function test, the fifth identification fuse 42 is cut off. Furthermore, the identification pads 5a–5p function as outputting elements dedicated to output states of the individual identification fuses 4a–4p to the outside.

Figure 13:
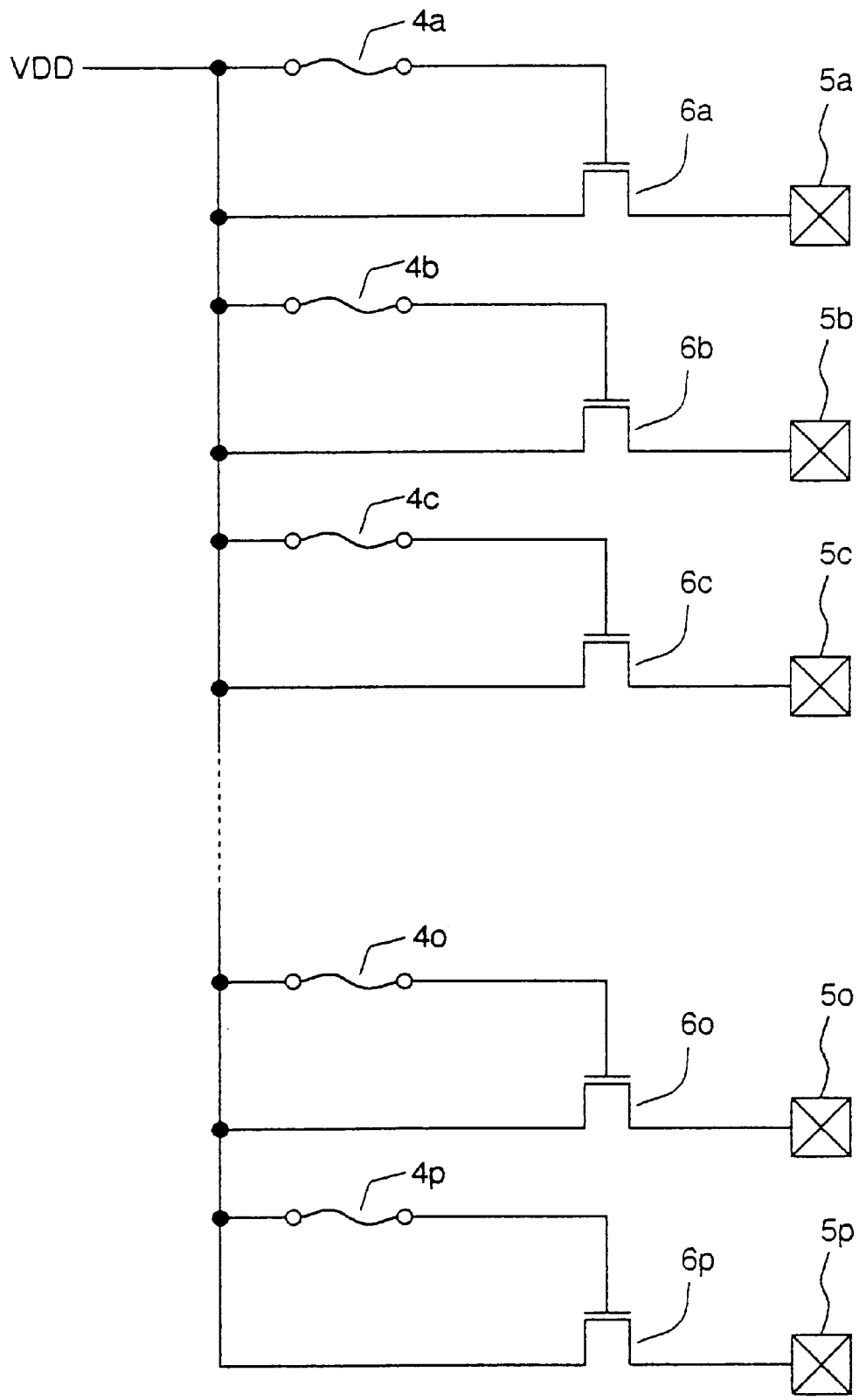
FIG. 13 is a circuit diagram showing a relationship between an identification fuse and an identification pad in the embodiment 4.

A connecting relationship between the identification fuses 4a–4p and the identification pads 5a–5p is as shown in FIG. 13. That is, one end of each of the identification fuses 4a–4p is connected to the power supply voltage VDD supplied from outside, and the other ends thereof are connected to switch terminals of switches 6a–6p. One of the terminal, exclusive of the switching terminal of each of the switches 6a–6p are connected to the power supply voltage, and the other terminals thereof are connected to the identification pads 5a–5p. If all the identification fuses 4a–4p are not cut off, the switches 6a–6p are switched ON upon an application of the power supply voltage, and electric potentials of the identification pads 5a–5p become the High level equal to the power supply voltage. If any one of the identification fuses 4a–4p is cut off, the switch corresponding to the cut-off identification fuse is switched OFF, and the electric potential of the identification pad corresponding thereto becomes unfixed (Hiz).

The wafer test for the semiconductor memory 1c in the embodiment 4 is carried out in the same processes as those in the embodiment 1. In the replacing process after the end of the primary inspection, however, if the chip is judged to be defective, any one of the identification fuses 4a–4p is cut off corresponding to the defect category. The way of dealing with the repairable chip is the same as the embodiment 1. In the defect judging test in the secondary inspection, the power supply voltage is applied to one end of the identification fuses 4a–4p, and electric potentials of the identification pads are detected. If the electric potentials of all the identification pads 5a–5p take the High level, the chio is judged to be good in quality. If the electric potential of any one of the identification pads is unfixed, the chip is judged to be defective.

According to the construction of the embodiment 4, it is possible to easily distinguish between the good-quality chip and the defective chip in the secondary inspection, and, in addition, it is feasible to detect from the chip itself the information on the error category of the defective chip that should be fed back to the manufacturing process. It is also possible to take a measure in the manufacturing process even when the defect category becomes unobvious in terms of record.

[Embodiment 5]

Figure 14:
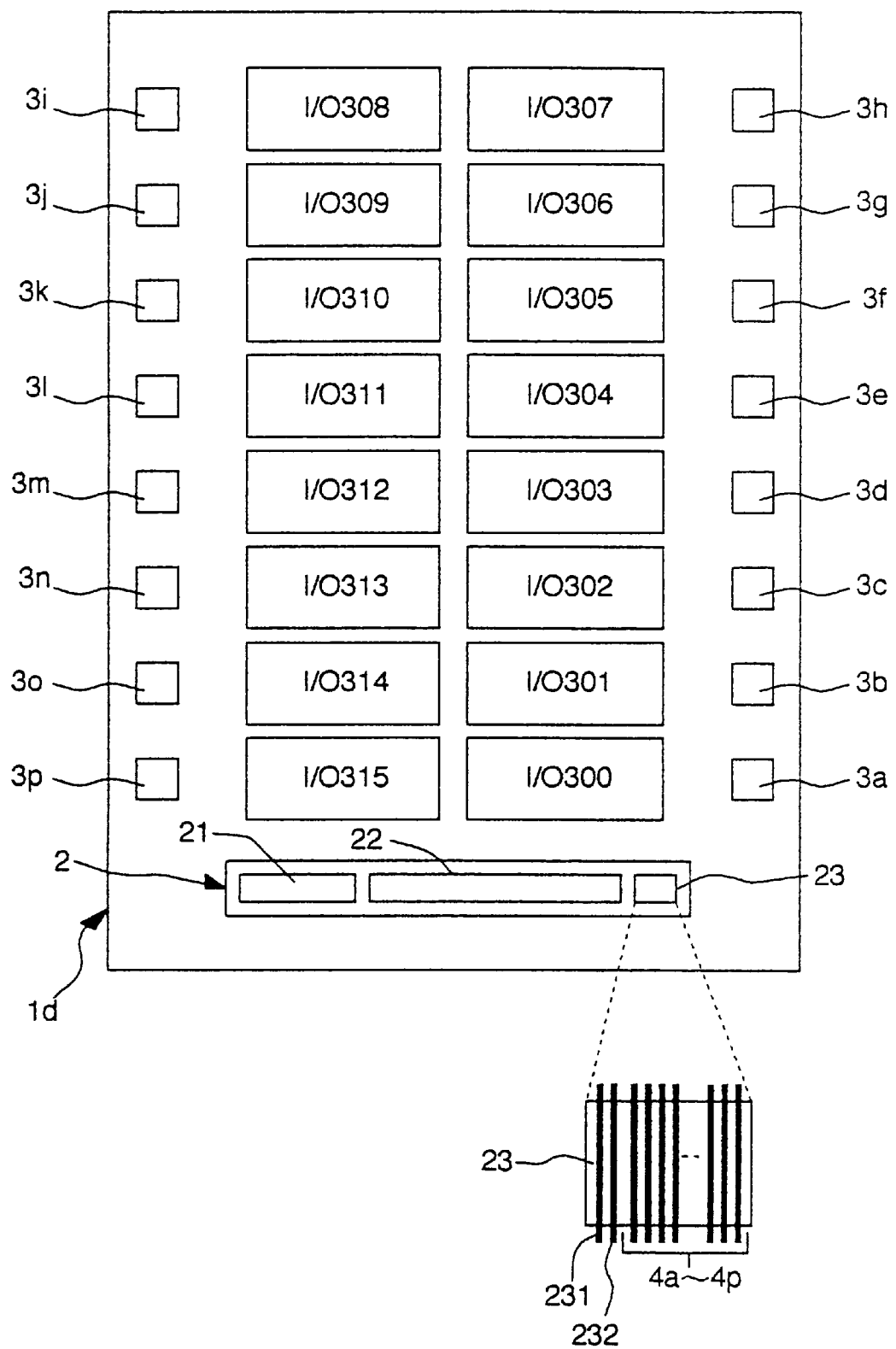
FIG. 14 is an explanatory diagram showing a construction of a semiconductor memory in an embodiment 5.

FIG. 14 shows a construction of a semiconductor memory in an embodiment 5. A semiconductor memory 1d in the embodiment 5 includes, as in the embodiment 1, the sixteen memory blocks I/0300–I/0315, the fuse area 2 containing the row redundancy fuse region 21, the column redundancy fuse region 22 and the operating fuse region 23, and the 16 I/O pads 3a–3p. Further, as in the embodiment 4, the operating fuse region 23 embraces two operating fuses 231, 232 and sixteen identification fuses 4a–4p which are arrayed in one direction. In the embodiment 5, all the 16-I/O pads 3a–3p function as double-duty pads serving also as outputting elements for outputting the states of the identification fuses 4a–4p to the outside. Note that the identification fuses 4a–4p are defined as dedicated fuses provided corresponding to the defect categories as in the embodiment 4.

Figure 15:
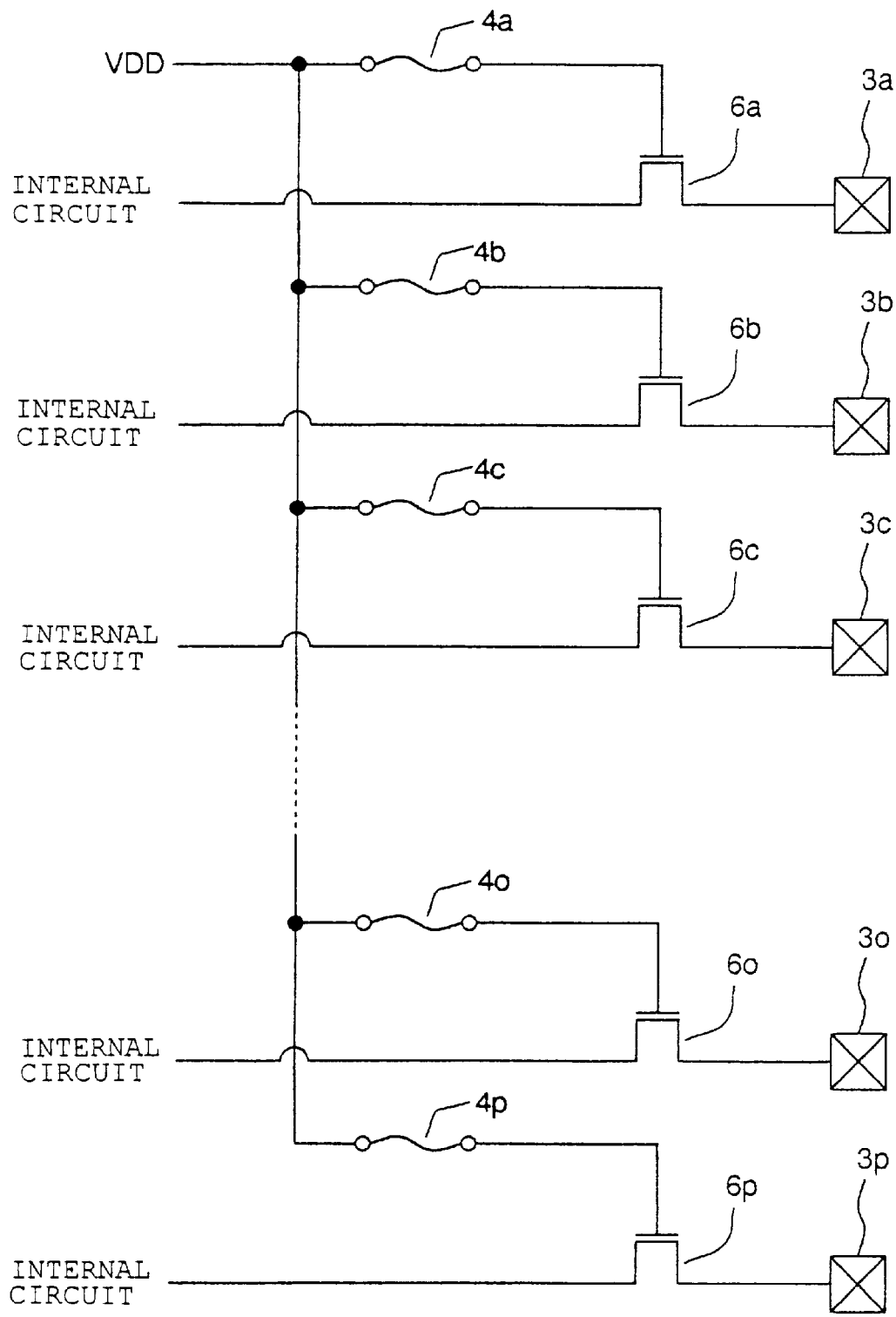
FIG. 15 is a circuit diagram showing a relationship between an identification fuse and a double-duty pad in an embodiment 5.

A connecting relationship between the identification fuses 4a–4p and the identification pads 5a–5p is as shown in FIG. 15. To be specific, one end of the identification fuses 4a–4p is connected to the power supply voltage VDD supplied from outside, and the other ends thereof are connected to the switch terminals of the gates 6a–6p. One terminals exclusive of the switching terminals of the switches 6a–6p are connected to the internal circuit, and the other terminals thereof are connected respectively to the I/O pads 3a–3p. If all the identification fuses 4a–4p are not cut off, the switches 6a–6p are switched ON upon the application of the power supply voltage, and electric potentials of the I/O pads 3a–3p become the High or Low level corresponding to the state of the internal circuit. If any one of the identification fuses 4a–4p is cut off, the switch corresponding to the cut-off identification fuse is switched OFF, and the corresponding I/O pad is disconnected from the internal circuit. Then, even when the power supply voltage is applied, the electric potential of the corresponding I/O pad becomes unfixed (Hiz).

The wafer test for the semiconductor memory 1d in the embodiment 5 is carried out in the same processes as those in the embodiment 4. That is, in the replacing process after the end of the primary inspection, if the chip is judged to be defective, any one of the identification fuses 4a–4p is cut off corresponding to the defect category. In the defect judging test in the secondary inspection, the power supply voltage is applied to one end of the identification fuses 4a–4p, and the internal circuit connected to the switches 6a–6p is fixed so that the output thereof assumes the High level. With this contrivance, if the electric potentials of all the I/O pads 3a–3p take the High level, the chip is judged to be good in quality. If the electric potential of any one of the I/O pads is unfixed, the chip is judged to be defective. Furthermore, the defect category can be distinguished by specifying the I/O pad the electric potential of which has become unfixed.

According to the construction of the embodiment 5, it is feasible to easily distinguish between the good-quality chip and the defective chip in the secondary inspection, and, in addition, it is possible to detect from the chip itself the information on the error category of the defective chip that should be fed back to the manufacturing process. Further, the existing I/O pads serve as the identification pads, thereby eliminating the necessity for changing the design of the pad with respect to the conventional type of chip provided with no identification fuse and also making it feasible to divert the layout of the conventional type of pad as it is. Especially, the double-duty pads as in the embodiment 5 are useful for the chip which is hard to ensure the space for providing more pads.

[Embodiment 6]

Figure 16:
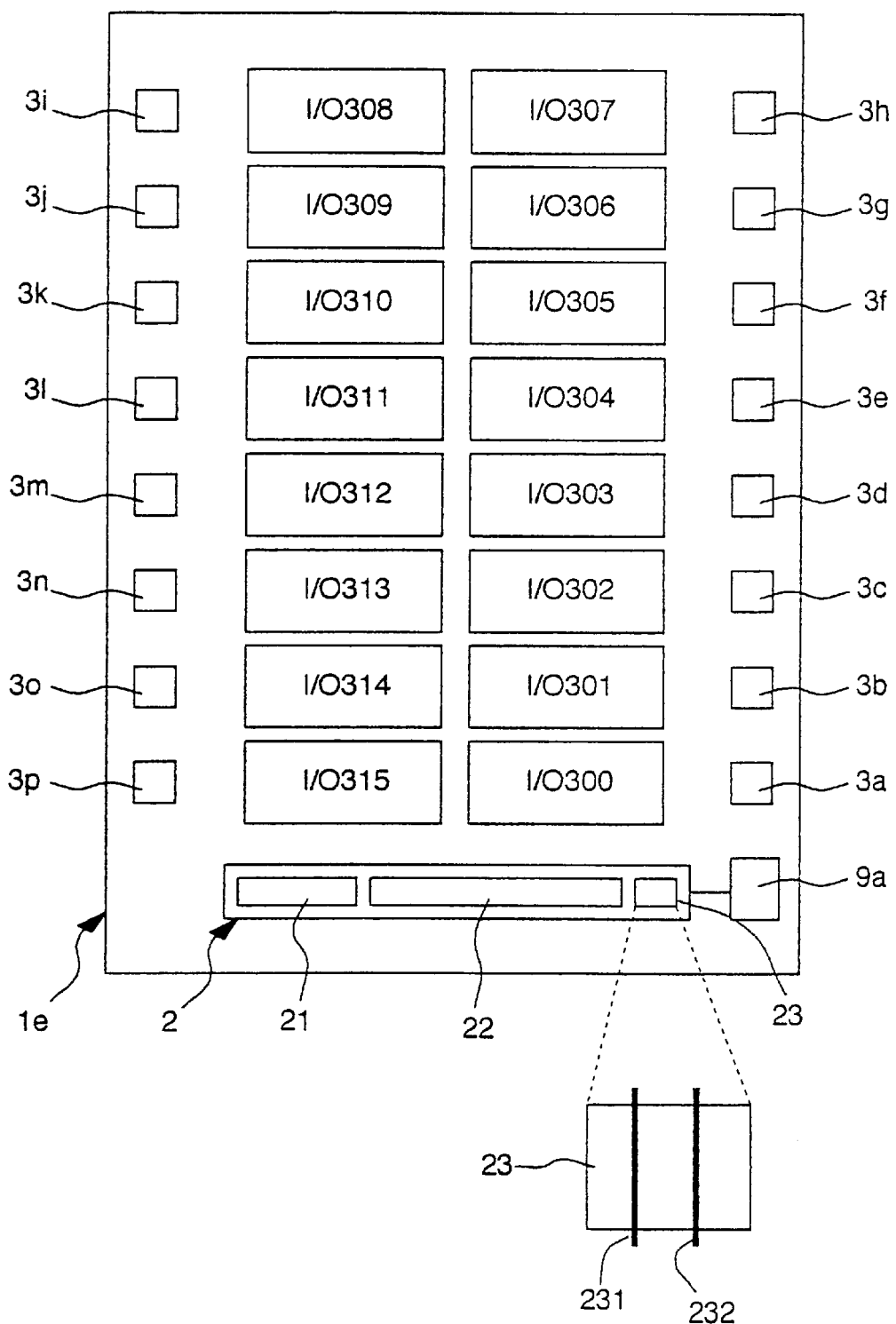
FIG. 16 is an explanatory diagram showing a construction of a semiconductor memory in an embodiment 6.

FIG. 16 shows a construction of a semiconductor memory in an embodiment 6. A semiconductor memory 1e in the embodiment 6 includes, as in the embodiment 1, the sixteen memory blocks I/0300–I/0315, the fuse area 2 containing the row redundancy fuse region 21, the column redundancy fuse region 22 and the operating fuse region 23, and the 16 I/O pads 3a–3p. In the embodiment 6, however, there is provided no fuse dedicated to the defect identification, and the operating fuse region embraces only the row operating fuse 231 and the column operating fuse 232. Further, the 16-fuses included in the column redundancy fuses serve as double-duty fuses used for the defect identification, and there is provided a judging circuit 9a connected to these double-duty fuses and to the column operating fuse 232 contained in the operating fuse region 23.

The column redundancy fuses in the embodiment 6, as in the same way with the column redundancy fuses in the embodiment 1 shown in FIG. 5, include 256 column address designation fuses 221 and 16 column select fuses 222. These sixteen column select fuses 222 serve as a function of determining whether the designation by the column address designation fuse 221 is valid or invalid, and a function of a recording element in which the state is set corresponding to the defect category. The outputting element involves, as in the embodiment 5, such a contrivance that all the I/O pads 3a–3p are used as double-duty pads. These I/O pads 3a–3p correspond to the respective 16-column select fuses 222.

Figure 17:
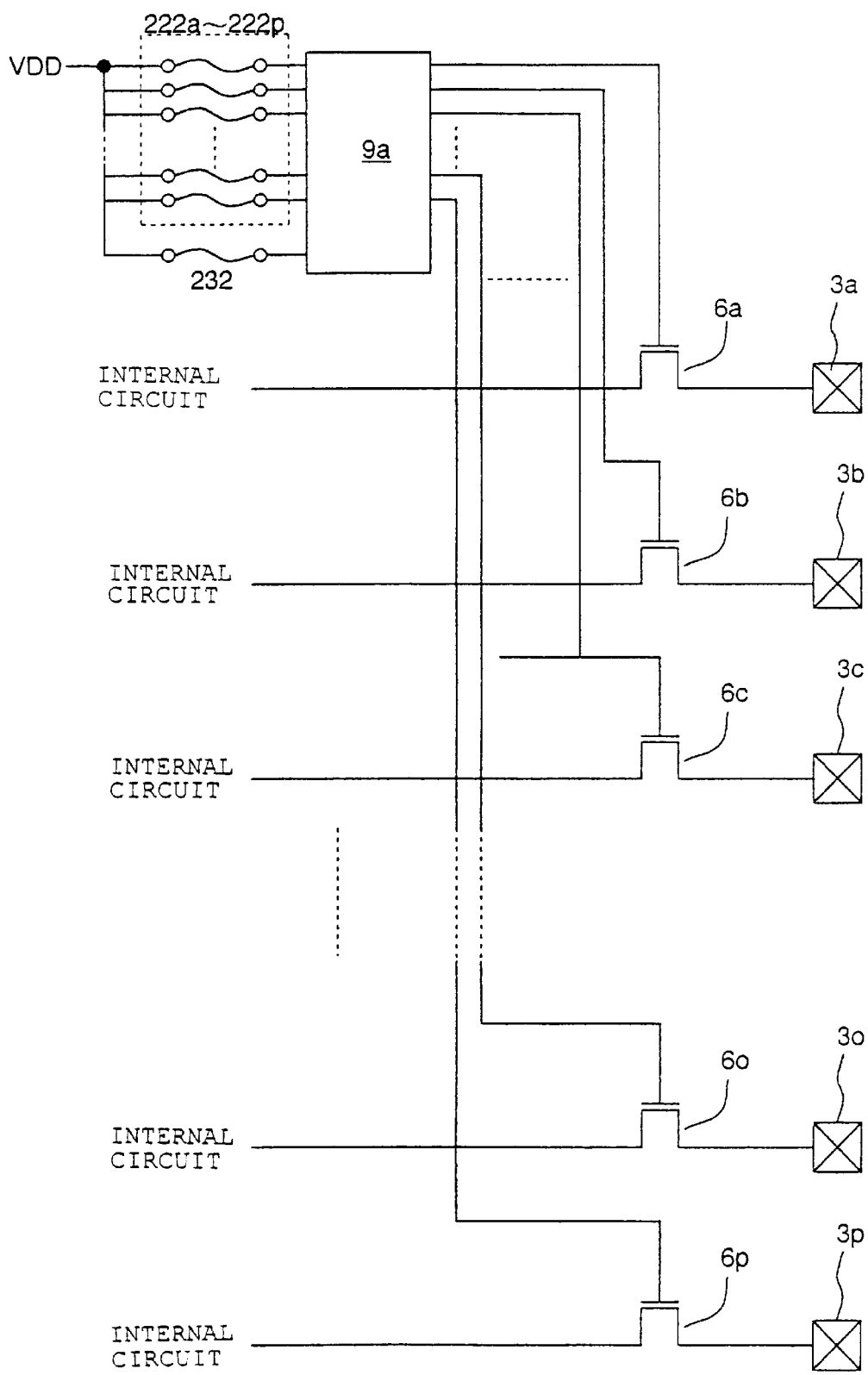
FIG. 17 is a circuit diagram showing a relationship between a fuse, a judging circuit and a double-duty pad in the embodiment 6.

A connecting relationship between the respective fuses, the I/O pads 3a–3p and the judging circuit 9a is as shown in FIG. 17. To be specific, one end of each of the column select fuses 222 and of the column operating fuse 232 are connected to the power supply voltage VDD supplied from outside, and the other ends thereof are connected to the judging circuit 9a. Sixteen output lines extending from the judging circuit 9a are connected to switching terminals of sixteen of switches 6a–6p. One terminal, excluding the switching terminal, of each of the switches 6a–6p is connected to the internal circuit, and the other terminals thereof are respectively connected to the I/O pads 3a–3p. The judging circuit 9a monitors a state of the column select fuse 222 and a state of the column operating fuse 232, and individually controls the switches 6a–6p in accordance with the states of these fuses.

The judging circuit 9a switches ON all the switches 6a–6p in a case where any one of the column select fuses 222 is cut off, and the column operating fuse 232 is cut off, and in a case where any of these fuses is not fused. As a result, all the I/O pads 3a–3p are electrically connected to the internal circuit. On the other hand, if the column operating fuse 232 is not cut off in spite of the fact that the any one of the column select fuses 222 is cut off, the judging circuit 9a judges that the chip is defective and therefore switches OFF the switch corresponding to the cut-off fuse. As a consequence, the I/O pad corresponding to the cut-off fuse is electrically disconnected from the internal circuit. That is, the judging circuit 9a incorporates a function of judging, if the column select fuse if cut off, whether or not this fuse is cut off for the reason of the replacement with the redundancy memory or the reason of the chip being defective.

The wafer test for the semiconductor memory 1e in the embodiment 6 is carried out in the same processes as those in the embodiment 4. That is, in the replacing process after the end of the primary inspection, if the chip is judged to be defective, any one of the column select fuses 222 is cut off corresponding to the defect category. In the defect judging test in the secondary inspection, the power supply voltage is applied to one ends of the column select fuse and of the column operating fuse 232, and the internal circuit connected to the switches 6a–6p is fixed so that the output thereof assumes the High level. With this contrivance, if the electric potentials of all the I/O pads 3a–3p take the High level, the chip is judged to be good in quality. If the electric potential of any one of the I/O pads is unfixed, the chip is judged to be defective. Furthermore, the defect category can be distinguished by specifying the I/O pad the electric potential of which has become unfixed.

According to the construction of the embodiment 6, it is feasible to easily distinguish between the good-quality chip and the defective chip in the secondary inspection, and, in addition, it is possible to detect from the chip itself the information on the error category of the defective chip that should be fed back to the manufacturing process. Further, the existing I/O pads serve as the identification pads, thereby eliminating the necessity for changing the design of the pad with respect to the conventional type of chip provided with no identification fuse and also making it feasible to divert the layout of the conventional type of pad as it is. Moreover, there is no necessity for newly providing more dedicated identification fuses as in the embodiment 4 and 5 t the conventional semiconductor memory provided with no identification fuse, and the increase in the number of fuses can be avoided.

As discussed above, according to each of the inventions in the present application, when the chip is judged to be defective enough to be unrepairable in the primary inspection, the identification fuse is cut off in the repairing process, and the state of the identification fuse is detected in the secondary inspection, whereby it is feasible to readily judge that the relevant chip is defective. Then, the inspection for a next chip can continue without executing the testing processes onwards, and the time required for the secondary inspection can be reduced.

According to the first aspect, the redundancy fuses and the identification fuse are disposed in the side-by-side relationship within the same fuse region, and hence, even when any fuse becomes a target to be cut off, it may suffice that the laser head of the repair device is positioned with respect to the fuse within the fuse region. Then, the positioning range of the laser head with respect to the single chip can be limited small, and the yield in the replacing process can be enhanced.

Further, according to the second aspect, the defective chip is given the information on the defect categories, whereby the information on the error category of the defect chip that should be fed back to the manufacturing process, can be detected from the chip itself. Then, even if the error category becomes unobvious in terms of record, the measure in the manufacturing process can be taken.

Moreover, according to the third aspect, a part of the address designation redundancy fuses serve as the defect judging elements, thereby eliminating the necessity for newly providing more dedicated identification fuses to the conventional semiconductor memory provided with no identification fuse and making it possible to avoid the increase in the number of fuses.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A semiconductor memory device comprising:

a predetermined number of regular memory cells;

a plurality of redundancy memory cells for replacing one or more of said regular memory cells;

an I/O pad serving as a connecting point to an outside of an internal circuit of said semiconductor memory device including said regular memory cells and said redundancy memory cells;

a redundancy fuse, cut off when one of said regular memory cells is defective, to replace the defective regular memory cell with one of said redundancy memory cells by designating the defective memory cell;

an identification fuse provided within a fuse region in a side-by-side relationship with said redundancy fuse and cut off when the semiconductor memory device is unrepairable; and an outputting circuit for outputting from said semiconductor memory device a state of said identification fuse.

2. A semiconductor memory device according to claim 1, wherein said fuse region includes an operating fuse which is cut off to make effective the designation by said redundancy fuse, and wherein said identification fuse is disposed adjacent to said operating fuse.

3. A semiconductor memory according to claim 1, wherein said identification fuse is constructed of a single fuse.

4. A semiconductor memory device according to claim 1, wherein said identification fuse is constructed of a plurality of fuses, and when said semiconductor memory device has a repairable defect a specified fuse among said plurality of fuses is cut off corresponding to a defect category.

5. A semiconductor memory device comprising:

a predetermined number of regular memory cells;

a plurality of redundancy memory cells for replacing one or more of said regular memory cells;

an I/O pad serving as a connecting point to an outside of an internal circuit of said semiconductor memory device including said regular memory cells and said redundancy memory cells;

a redundancy fuse, cut off when one of said regular memory cells is defective, to replace the defective regular memory cell with one of said redundancy memory cells by designating the defective memory cell;

a plurality of recording circuits, each corresponding to a defect category, wherein when said semiconductor memory device is unrepairable a state is set corresponding to a defect of said semiconductor memory device; and an outputting circuit for outputting from said semiconductor memory device at least one state corresponding to one of said recording circuits.

6. A semiconductor memory according to claim 5, wherein said recording circuit includes an identification fuse provided separately from said redundancy fuse.

7. A semiconductor memory device according to any one of claims 1, 2, 3, 4 and 6, wherein said outputting circuit comprises a dedicated identification pad, provided separately from said I/O pad, for detecting a state of said identification fuse.

8. A semiconductor memory device according to any one of claims 1, 2, 3, 4 and 6, wherein said outputting circuit includes a double-duty pad serving also as said I/O pad, and wherein when said identification fuse is not cut off, said double-duty pad is electrically connected to said internal circuit and, when said identification fuse is cut off, said double-duty pad is electrically disconnected from said internal circuit.

9. A semiconductor memory according to claim 5, further comprising:

an operating fuse cut off when making effective the designation by said redundancy fuse; and a judging circuit for determining that said semiconductor memory device is unrepairable when one or more of said redundancy fuses is cut off while said operating fuse is not cut off, wherein said outputting circuit outputs a state of said double-duty fuse when said judging circuit determines that said semiconductor memory device is unrepairable.

10. A semiconductor memory device comprising:

a predetermined number of regular memory cells;

a plurality of redundancy memory cells for replacing one or more of said regular memory cells;

an I/O pad serving as a connecting point to an outside of an internal circuit of said semiconductor memory device including said regular memory cells and said redundancy memory cells;

a redundancy fuse, cut off when one of said regular memory cells is defective, to replace the defective regular memory cell with one of said redundancy memory cells by designating the defective memory cell, one of said redundancy fuses being used as a double-duty fuse for a defect identification;

an operating fuse which is cut off to make effective the designation by said redundancy fuse;

a judging circuit for determining that said semiconductor memory device is unrepairable when said double-duty fuse is cut off while said operating fuse is not cut off; and an outputting circuit for outputting a state of said double-duty fuse when said judging circuit determines that said semiconductor memory device is unrepairable.

11. A semiconductor memory device according to any one of claims 9 and 10, wherein said outputting circuit comprises a double-duty pad serving also as said I/O pad, wherein when said semiconductor memory device is judged to have a repairable defect, said double-duty pad is electrically disconnected from said internal circuit and when said semiconductor memory device has no defect, said double-duty pad is electrically connected to said internal circuit.

12. A semiconductor memory according to claim 10, wherein said double-duty fuse is constructed of a single fuse among said plurality of redundancy fuses.

13. A semiconductor memory according to claim 10, wherein said double-duty fuse is constructed of a plurality of fuses among a plurality of redundancy fuses, and when said semiconductor memory device is unrepairable, one of said plurality of fuses comprising said double-duty fuse is cut off, corresponding to a defect category.

* * * * *